(12) United States Patent
Lee et al.

(10) Patent No.: US 9,755,647 B1
(45) Date of Patent: Sep. 5, 2017

(54) TECHNIQUES FOR HANDLING HIGH VOLTAGE CIRCUITRY IN AN INTEGRATED CIRCUIT

(71) Applicant: Altera Corporation, San Jose, CA (US)

(72) Inventors: Andy Lee, San Jose, CA (US); Herman Schmit, Palo Alto, CA (US)

(73) Assignee: Altera Corporation, San Jose, CA (US)

( * ) Notice: Subject to any disclaimer, the term of this patent is extended or adjusted under 35 U.S.C. 154(b) by 0 days.

(21) Appl. No.: 15/294,588

(22) Filed: Oct. 14, 2016

(51) Int. Cl.
  *G06F 7/38* (2006.01)
  *H03K 19/173* (2006.01)
  *H03K 19/177* (2006.01)

(52) U.S. Cl.
  CPC ............................. *H03K 19/17724* (2013.01)

(58) Field of Classification Search
  None
  See application file for complete search history.

(56) References Cited

U.S. PATENT DOCUMENTS

| | | | | |
|---|---|---|---|---|
| 6,140,837 A | * | 10/2000 | Eaton | H01L 27/11807 257/E21.625 |
| 7,598,794 B1 | * | 10/2009 | Stansell | H03K 19/00315 327/434 |
| 7,782,110 B1 | * | 8/2010 | Koniaris | H03K 19/0027 327/291 |

* cited by examiner

*Primary Examiner* — Anh Tran

(57) ABSTRACT

An integrated circuit formed using a semiconductor substrate may include a logic circuit and a switch circuit, whereby the logic circuit operates at a first power supply voltage and the switch circuit operates at a second power supply voltage that is greater than the first power supply voltage. The logic circuit may be formed within a first triple well structure within the semiconductor substrate and is supplied with a first bias voltage. The switch circuit may be formed within a second triple well structure that is electrically isolated from the first triple well structure within the semiconductor substrate and is supplied with a second bias voltage. The switch circuit may receive a control signal that controls the first bias voltage and the second power supply voltage to turn off a transistor in the logic circuit during a programming operation of the integrated circuit.

21 Claims, 8 Drawing Sheets

TECHNIQUES FOR HANDLING HIGH VOLTAGE CIRCUITRY IN AN INTEGRATED CIRCUIT

FIELD OF THE DISCLOSURE

The present disclosure relates to electrical circuits, and more particularly, to techniques for handling high voltage circuitry in an integrated circuit.

BACKGROUND

A typical programmable integrated circuit may use transistors to implement programmable switches, which are needed for both programmable logic and programmable routing structures within the integrated circuit. N-type metal-oxide-semiconductor (NMOS) pass gates may be used to implement the programmable switches in some cases, while in other cases, static complementary metal oxide semiconductor (CMOS) pass gates with both NMOS and P-type metal-oxide-semiconductor (PMOS) transistors may be used to implement the programmable switches. For either one of these cases, voltage reliability requirements may prevent too high a voltage from being applied across any two ports of the NMOS or PMOS transistors.

Instead of using NMOS or PMOS transistors for the programmable structures, alternative switch structures are continually being evaluated for use within a programmable integrated circuit. The alternative switch structures are generally non-volatile, which means that the switch structures do not lose programming state when the power supply is powered down. But in order to program these non-volatile alternative switch structures, a higher voltage is typically needed to facilitate the switch programming. The need for the switches to maintain their programmed operations during normal mode of operation (i.e., without getting accidentally reprogrammed) implies that the programming voltage must be at a higher voltage than the normal logic operating voltage of the integrated circuit. However, the problem of overdriving other circuit elements such as logic circuits may arise when providing the higher voltage to the switch structures. Such a problem may cause device reliability issues and subsequently lead to device failure.

SUMMARY

The present invention provides techniques for handling high voltage circuitry in an integrated circuit. The present invention can be implemented in numerous ways, such as a process, an apparatus, a system, or a device. Several embodiments of the present invention are described below.

An integrated circuit formed using a semiconductor substrate is disclosed. The integrated circuit includes a logic circuit and a switch circuit. The logic circuit operates at a first power supply voltage and the switch circuit operates at a second power supply voltage that is greater than the first power supply voltage. The logic circuit is formed within a first triple well structure within the semiconductor substrate that is supplied with a first bias voltage. The switch circuit is formed within a second triple well structure that is electrically isolated from the first triple well structure within the semiconductor substrate and is supplied with a second bias voltage. The switch circuit receives a control signal that controls the first bias voltage during a programming operation of the integrated circuit.

Another integrated circuit is disclosed. The integrated circuit includes a logic circuit that operates in a first power supply domain and a switch circuit that operates in a second power supply domain that is different than the first power supply domain. The logic circuit receives a first bias signal on a first signal path. The switch circuit receives a second bias signal on a second path that is different than the first signal path and a control signal that controls a voltage of the first bias signal to turn off a transistor in the logic circuit during a programming operation of the integrated circuit.

A method of operating an integrated circuit is disclosed. The method includes receiving a first bias signal using a logic circuit through a first signal path and a second bias signal using a switch circuit through a second signal path that is different than the first signal path. The logic circuit operates in a first power supply voltage and the switch circuit operates in a second power supply voltage that is higher than the first power supply voltage. The method further includes controlling a voltage of the first bias signal to the logic circuit in response to a control signal to turn off a transistor in the logic circuit during a programming operation of the integrated circuit. For example, the voltage of the first bias signal is adjusted relative to the first power supply voltage or a voltage of the second bias signal based on a logic state of the control signal.

Further features of the invention, its nature, and various advantages, will be more apparent from the accompanying drawings and the following detailed description of the preferred embodiments.

DETAILED DESCRIPTION

The embodiments provided herein include techniques for handling high voltage circuitry for an integrated circuit.

Figure 1:
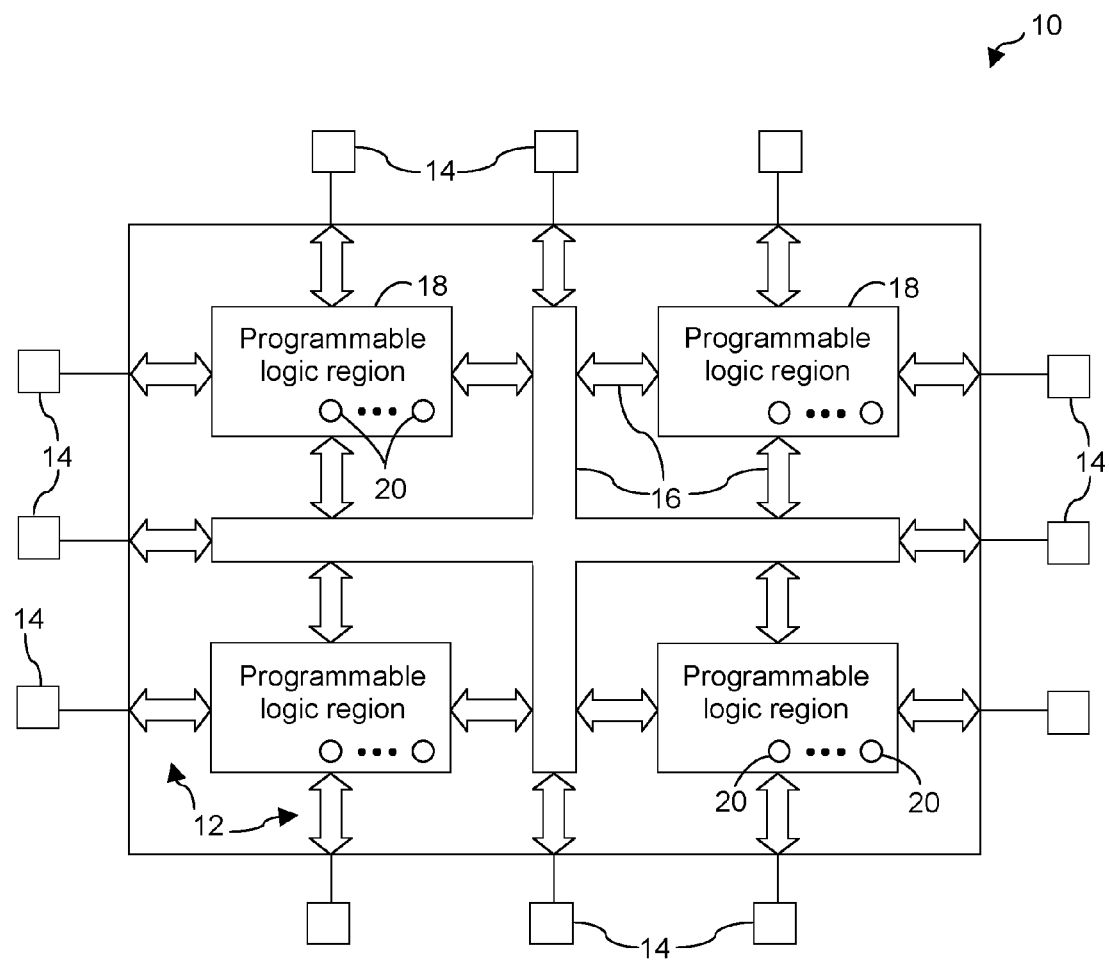
FIG. 1 shows a block diagram of an illustrative integrated circuit in accordance with an embodiment of the present invention.

FIG. 1 is a diagram of an illustrative integrated circuit 10 in accordance with an embodiment of the present invention. Integrated circuit 10 has input-output (IO) circuitry 12 for driving signals off of integrated circuit 10 and for receiving signals from other circuits or devices via IO pins 14. Interconnection resources 16 such as global and local vertical and horizontal conductive lines and busses may be used to route signals on integrated circuit 10. Interconnection resources 16 include fixed interconnects (conductive lines) and programmable interconnects (e.g., programmable connections between respective fixed interconnects). The programmable interconnects associated with interconnection resources 16 may be considered to be a part of programmable logic regions 18.

Memory elements 20 may be formed using complementary metal-oxide-semiconductor (CMOS) integrated circuit technology (as an example). In the context of a programmable logic device, memory elements 20 may store configuration data and are therefore sometimes referred to as configuration random-access memory (CRAM) cells. In general, configuration random-access memory elements 20 may be arranged in an array pattern. In a programmable integrated circuit, there may be millions of memory elements 20 on a single device. A user (e.g., a logic designer) may provide configuration data for the array of memory elements during programming operation. Once loaded with configuration data, memory elements 20 may selectively control (e.g., turn on and off) portions of the circuitry in programmable logic regions 18 and thereby customize its functions as desired.

Horizontal and vertical conductors and associated control circuitry may be used to access memory elements 20 when memory elements 20 are arranged in an array. The control circuitry, for example, may be used to clear all or some of the memory elements. The control circuitry may also write data to memory elements 20 and may read data from memory elements 20. Memory elements 20 may be loaded with configuration data, for instance, in CRAM arrays. The loaded configuration data may then be read out from the memory array to confirm proper data capture before integrated circuit 10 is used during normal operation in a system.

The circuitry of integrated circuit 10 may be organized using any suitable architecture. For example, programmable logic regions 18 may be organized in a series of rows and columns of larger programmable logic regions each of which contains multiple smaller regions. The larger regions are sometimes referred to as logic array blocks. The smaller logic regions are sometimes referred to as logic elements. A typical logic element may contain a look-up table, registers, and programmable multiplexers. If desired, programmable logic regions 18 may be arranged in more levels or layers in which multiple large regions are interconnected to form still larger portions of logic.

In addition to the relatively large blocks of programmable logic regions 18 that are shown in FIG. 1, integrated circuit 10 generally also includes some programmable logic components associated with IO circuitry 12 on integrated circuit 10. For example, IO circuitry 12 may include switch circuits (or switches). The switch circuits may allow flexible and scalable cross connections between various components in the programmable logic regions 18 on integrated circuit 10. The switch circuits may also allow communication between selected inputs and outputs for programmable logic regions 18 to interconnection resources 16 or IO circuitry 12 to and from components on the integrated circuit or devices external to the integrated circuit. Programming the switch circuits typically requires high voltage to be supplied in order to maintain the programmed operations of the switch circuits during the normal mode of operation. However, this may result in overdriving low-voltage logic circuits within programmable logic regions 18 when providing the high voltage to the switch circuits during a switch programming operation. Such a problem may cause device reliability issues and subsequently damage the integrated circuit.

To solve this problem, an efficient high voltage handling mechanism is required to ensure that no voltage-sensitive devices will be subjected to high voltage, and that no significant current contention will occur during power supply transitions during the switch programming operation. Such a mechanism, which will be described in detail below, may electrically isolate the high-voltage switch circuits from voltage-sensitive circuit elements (e.g., logic circuits) within integrated circuit 10. Such a mechanism may also provide the ability to adjust power supply voltage levels to enable switch circuits to be powered at a higher voltage without causing any contention problems with other low-voltage circuit elements.

Figure 2:
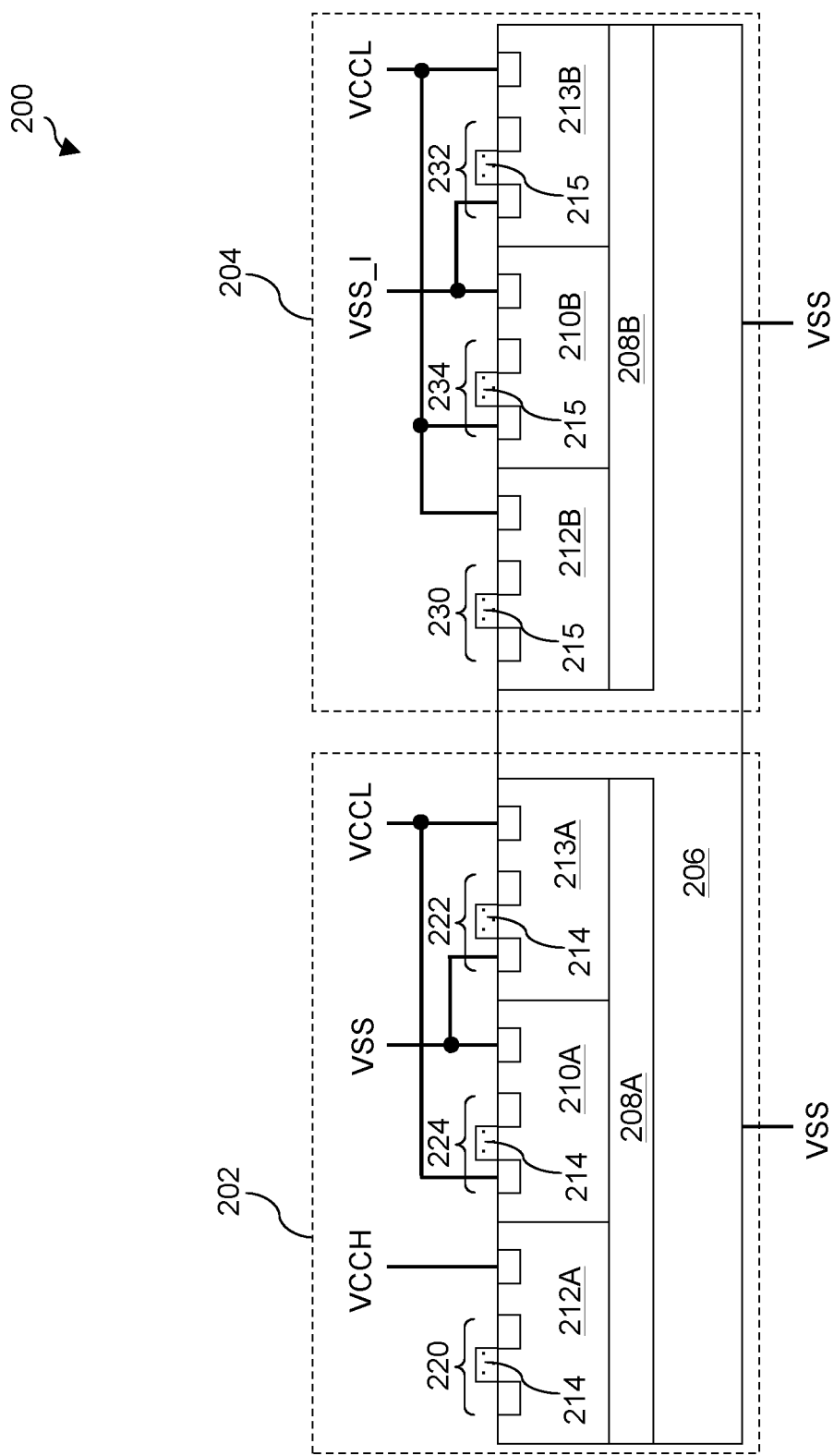
FIG. 2 shows a structure of an illustrative integrated circuit formed in a semiconductor substrate in accordance with an embodiment of the present invention.

FIG. 2 shows a structure of an illustrative integrated circuit 200 formed in semiconductor substrate 206 in accordance with an embodiment of the present invention. Integrated circuit 200 includes switch circuit 202 and logic circuit 204. Switch circuit 202 may include three transistors (e.g., P-type metal-oxide-semiconductor (PMOS) transistors 220 and 222, and N-type metal-oxide-semiconductor (NMOS) transistor 224), which are implemented as thick oxide devices. Accordingly, logic circuit 204 may include three transistors (e.g., PMOS transistors 230 and 232, and NMOS transistor 234), which are implemented as thin-oxide devices. That is, a layer of oxide material that is formed underneath each of gate stacks 214 (or polysilicon gates 214) of transistors 220, 222, and 224 is thicker than a corresponding layer of oxide material in each of gate stacks 215 (or polysilicon gates 215) of transistors 230, 232, and 234.

Thick-oxide devices are generally ideal for sustaining high voltage in interface circuitry such as switch circuit 202, and thin-oxide devices are preferred for sustaining high speed and lower power consumption in digital core circuitry such as logic circuit 204. In one embodiment, switch circuit 202 and logic circuit 204 may operate at different voltage levels to accommodate transfer of signals from a higher supply voltage to a lower supply voltage, and vice versa. For example, switch circuit 202 and logic circuit 204 may be supplied with a lower power supply voltage (e.g., positive power supply voltage level VCCL) for normal signal transmission operation (i.e., during a user mode). When a programming mode is activated on integrated circuit 200, switch circuit 202 may be supplied with a higher operating voltage (e.g., positive power supply voltage level VCCH) to facilitate a switch programming operation (i.e., selectively switch programming data between adjacent columns of logic regions (e.g., programmable logic regions 18 of FIG. 1) in integrated circuit 200). However, the higher voltage may potentially overdrive logic circuit 204 and damage or destroy the internal circuitry of integrated circuit 200.

To prevent the overdriving problem, a triple well process can be used to provide electrical isolation between switch circuit 202 and logic circuit 204. In an exemplary embodiment shown in FIG. 2, switch circuit 202 and logic circuit 204 may be formed using the triple well process in substrate 206. Substrate 206 is a positively doped (P-type) substrate that is connected to ground (e.g., VSS) of integrated circuit 200. Hence, substrate 206 may also be referred to as P-type substrate 206. In switch circuit 202, NMOS transistor 224 is formed within an isolated P-type well (positively doped region, e.g., R-Well 210A), within larger N-wells 212A and 213A, which in turn reside within P-type substrate 206. PMOS transistors 220 and 222 are formed within the respective N-wells 212A and 213A, which also reside within P-type substrate 206. Similarly, in logic circuit 204, NMOS transistor 234 is formed within R-Well 210B, within larger N-wells 212B and 213B, which in turn reside within P-type substrate 206. PMOS transistors 230 and 232 of logic circuit 204 are formed within the respective N-wells 212B and 213B, which also reside within P-type substrate 206. Each of switch circuit 202 and logic circuit 204 is formed in a separate deep N-well (e.g., deep N-wells 208A and 208B), which electrically isolates switch circuit 202 and logic circuit 204 from each other and from P-type substrate 206.

Accordingly, separate power supply voltage rails, known as bias voltages, can be provided externally or internally for both switch circuit 202 and logic circuit 204. A bias voltage of power supply voltage source VSS (also referred to as bias voltage VSS herein) may be applied to a region (e.g., N+ region) of R-well 210A of switch circuit 202, and another bias voltage of a power supply voltage source (also referred to as bias voltage VSS_I herein) may be applied to a region (e.g., N+ region) of R-well 210B of logic circuit 204. In an embodiment of the present invention, back bias voltage VSS_I can be dynamically adjusted to provide different biases to turn off the transistors 230, 232, and 234 in logic circuit 204 to cut off a conductive path between switch circuit 202 and logic circuit 204. This is to avoid overdriving logic circuit 204 during a high-voltage switch programming operation. A more detailed description on how VSS_I can be modified will be described below.

Figure 3A:
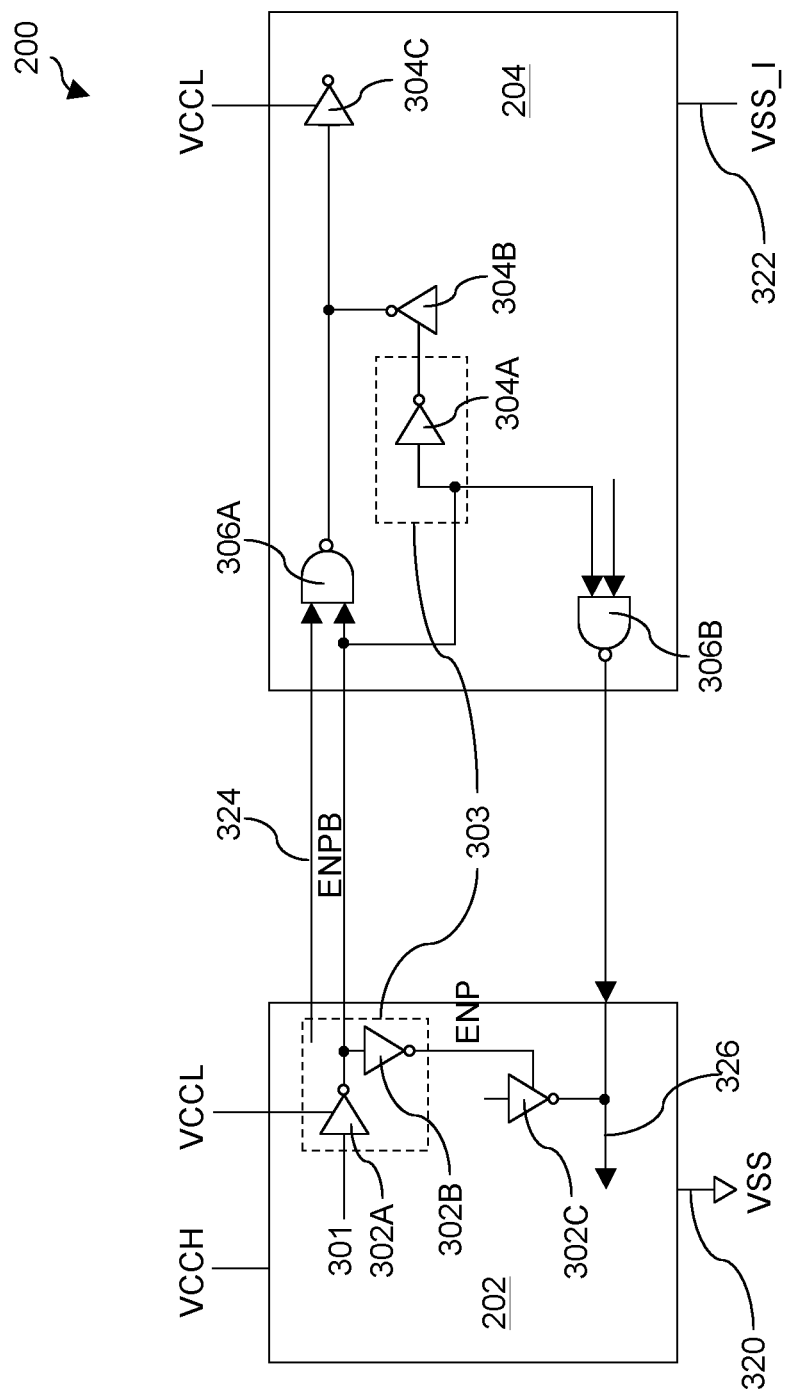
FIGS. 3A and 3B are corresponding circuit diagrams of the illustrative integrated circuit of FIG. 2 in accordance with one embodiment of the present invention.
Figure 3B:
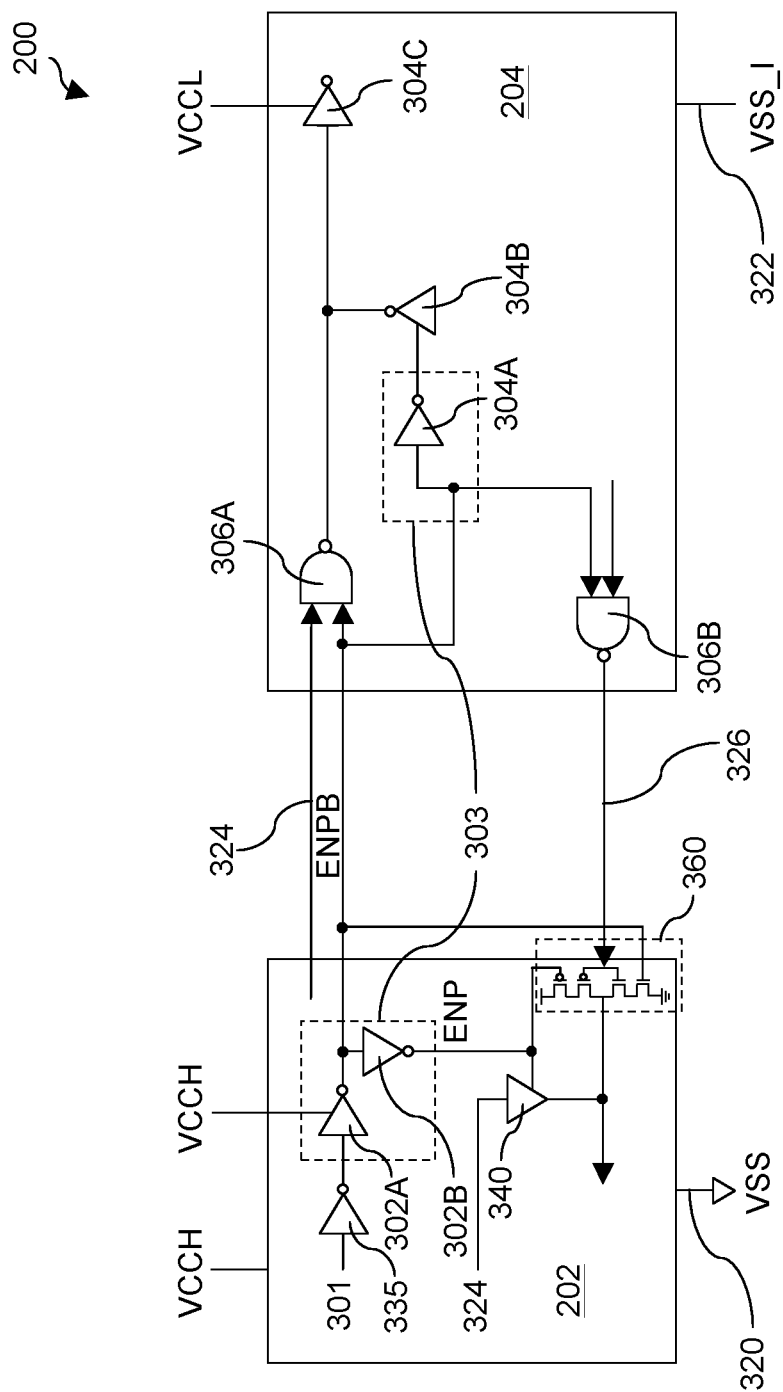

FIGS. 3A and 3B are corresponding circuit diagrams of the illustrative integrated circuit 200 of FIG. 2 in accordance with one embodiment of the present invention. As described above, integrated circuit 200 includes switch circuit 202 and logic circuit 204. Positive power supply voltages VCCH or VCCL may be provided to switch circuit 202. Positive power supply voltage VCCL may be provided to logic circuit 204. Ground voltage VSS may be provided from an external source to switch circuit 202 and logic circuit 204. As shown in FIG. 3A, switch circuit 202 may include three inverter driver circuits 302A, 302B, and 302C and logic circuit 204 may include three inverter driver circuits 304A, 304B, and 304C, and two NAND gates 306A and 306B. Inverter driver circuits 302A, 302B, and 304A may collectively be referred to as internal circuit 303. In one embodiment, internal circuit 303 enables the internal driving of input signals of switch circuit 202 and logic circuit 204.

As described above in FIG. 2, the use of triple well isolation in integrated circuit 200 allows logic circuit 204 to be biased separately from switch circuit 202 and P-type substrate 206 of FIG. 2. For example, as shown in FIG. 3, switch circuit 202 may receive a bias signal VSS and its corresponding bias voltage (collectively referred to as VSS herein) through signal path 320, and logic circuit 204 may receive another bias signal VSS_I and its corresponding bias voltage (collectively referred to as VSS_I herein) through signal path 322 that is different than signal path 320. Such a configuration enables VSS_I to be controlled, which will be described in an example below, to provide high voltage handling within integrated circuit 200 during the switch programming operation.

Referring to FIG. 3A, assume that logic circuit 204 can handle a maximum operating voltage of 1 volt (VCCL), across its transistor ports, and switch circuit 202 can operate with low voltages (VCCL) or high voltages (VCCH), depending on which mode the integrated circuit 200 operates. For example, in an embodiment of FIG. 3A, switch circuit 202 may have a voltage requirement of 1 volt, in which switch circuit 202 operates like a normal (logic) circuit during the user mode of integrated circuit 200. Alternatively, in another embodiment of FIG. 3B, switch circuit 202 may have a voltage requirement of 2 volts to facilitate the switch programming operation during the programming mode of the integrated circuit. It should be noted that a VSS of 0 volts may be used to represent a low logic level (a "0") and a VCCL of 1 volt may be used to represent a high logic level (a "1") in the following description.

When the programming mode is activated on integrated circuit 200, the input signals of switch circuit 202 may be driven to high voltage (e.g., VCCH) to facilitate the high-voltage switch programming operation. It should be appreciated that the circuit configuration of switch circuit 202 of FIG. 3B may be used to facilitate the switch programming operation. In this mode, control signal 301 is first applied to inverter driver circuit 335. An inverted version of control signal 301 is then applied to internal circuit 303, causing internal circuit 303 to generate (via inverter driver circuit 302A) a switch control signal ENPB of logic level "0" and its inverted signal ENP of logic level "1". The ENPB signal is provided to logic circuit 204 to set logic circuit 204 at a "don't care" state, which means that no matter what input signal (e.g., input signal 324) is applied to logic circuit 204 (through NAND gate 306A), the input signal will have no effect on the output of logic circuit 204, because the output signals of NAND gates 306A and 306B each remain at a logic level "1" in response to the ENPB signal being a logic level "0." Also, buffer circuit 360 is tri-stated (i.e., put into a high impedance state) in response to the ENPB signal being a logic level "0" and the ENP signal being at a logic high level "1." Such a configuration ensures that the output of logic circuit 204 can be driven out (through NAND gate 306B) at its nominal operating voltage (i.e., VCCL) prior to the switch programming operation.

Accordingly, VSS_I is adjusted relative to VCCL when the ENPB signal is asserted at logic level "0". As VSS_I is ramped towards VCCL, the output (e.g., output 326) of logic circuit 204 will be driven to a high impedance state, and VCCH can be increased (i.e. from 1 volt to 2 volts) accordingly for the switch programming operation. In this scenario, driver circuit 340 of switch circuit 202, which is controlled by the ENP signal, may be able to output high-voltage switch-programming logic input signals (e.g., input signals 324) to facilitate the switch programming operation. In one embodiment, logic circuit 204 may be disabled (or deactivated) from operating during the switch programming operation. Alternatively, in another embodiment, logic circuit 204 may act as an isolation circuit and isolate other logic circuits (not shown) from switch circuit 202 during the switch programming operation. For either one of the embodiments, the above configuration enables switch circuit 202 to drive the high-voltage input signals directly to program the integrated circuit 200 without causing current contention with the logic circuit(s).

Once the switch programming operation is completed, VCCH is lowered to VCCL, and switch circuit 202 will be able to drive its input signals to VCCL through internal circuit 303. In this scenario, VSS_I is adjusted relative to VSS, and thus enabling logic circuit 204 to drive its signals at VCCL. Such a configuration will not cause contention, because both switch circuit 202 and logic circuit 204 will be driving their signals to the same voltage levels (i.e., VCCL). Subsequently, the ENPB signal is de-asserted at logic level "1" to allow normal inter-block signals to operate normally in the user mode. With proper transitioning of power supply voltages and interface signals, it can be ensured that no thin-oxide devices such as in logic circuit 204 will be subjected to high voltage, and that no significant current contention will occur during the transitions of the power supply voltage due to a change between the two operating modes of integrated circuit 200.

Figure 4:
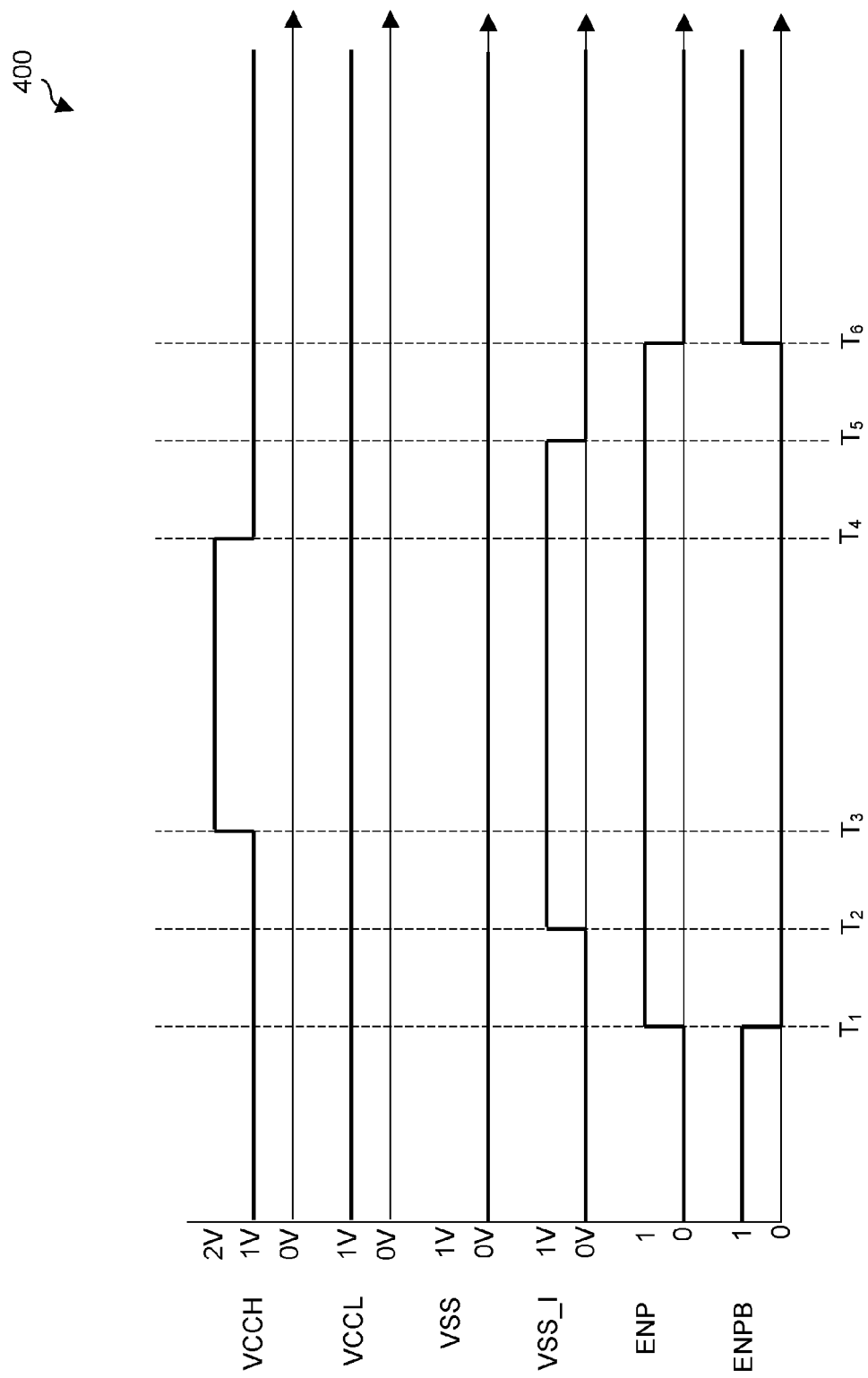
FIG. 4 is a timing diagram illustrating the behavior of signals during operation of an integrated circuit in accordance with one embodiment of the present invention.

FIG. 4 is a timing diagram 400 illustrating the behavior of relevant signals in the circuitry of FIGS. 2 and 3 in accordance with one embodiment of the present invention. It should be appreciated that the embodiments of FIGS. 2 and 3 may be used as examples to describe the timing diagram 400. As shown, timing diagram 400 illustrates the positive power supply voltage of switch circuit 202 (e.g., VCCH), positive power supply voltage signal of logic circuit 204 (e.g., VCCL), bias signal VSS of switch circuit 202, bias signal VSS_I of logic circuit 204, switch control signal ENPB (or ENPB signal), and an inverted version of switch control signal ENPB (i.e., ENP signal).

In an example described above with respect to FIG. 3A, assume that logic circuit 204 can handle a maximum operating voltage of 1 volts (e.g., VCCL) across its transistor ports, and switch circuit 202 has an operating voltage requirement of 2 volts (e.g., VCCH) to facilitate the high-voltage switch programming operation. When integrated circuit 200 is powered on, integrated circuit 200 may operate in normal operating mode (or user mode). In this mode, integrated circuit 200 is supplied with a source of current at a normal operating voltage level (e.g., VCCL) to be powered on.

At time $T_1$, the ENPB signal is asserted low (i.e., driven to VSS or logic "0" value) and an inverted version of ENPB (i.e., the ENP signal) is provided at logic "1" to trigger the switch programming operation within integrated circuit 200. As described above, a voltage that is higher than VCCL is typically needed to facilitate the switch programming operation. Hence, when switch programming operation is being done, the ENPB signal is driven to VSS to ensure that logic circuit 204 is at a "don't care" state from a contention standpoint, which means that any input signal that is applied to logic circuit 204 from switch circuit 202 will not have any effect on the output of logic circuit 204. Such a configuration ensures that the output of logic circuit 204 is driven out at its nominal operating voltage (i.e., VCCL) prior to the switch programming operation, which may then allow switch circuit 202 to drive its input internally and in parallel at VCCL.

At time $T_2$, VSS_I is ramped towards VCCL. Accordingly, VCCH is ramped towards a predetermined voltage at time $T_3$. During the time interval between $T_2$ and $T_3$, logic circuit 204 will be tri-stated (i.e., put into a high impedance state), causing the output (e.g., output 326) of logic circuit 204 to be driven out at high impedance. As a result, switch circuit 202 is able to drive the high-voltage switch-programming logic input signals (e.g., input signals 324) directly at the predetermined voltage (e.g., using driver circuit 340 of FIG. 3B) between times $T_3$ and $T_4$ to program the integrated circuit without affecting the normal operation of logic circuit 204. The predetermined voltage is higher than the normal operation voltage of the integrated circuit. The predetermined voltage may be a high voltage of, for example, 2 volts.

After the completion of the switch programming operation, switch circuit 202 will drive its input signals 324 to VCCL through internal circuit 303 of FIG. 3A. In this scenario, VCCH is lowered from the predetermined voltage level (i.e., 2 volts) and returned to the normal operation voltage (i.e., VCCL of 1 volt) at time $T_4$. Accordingly, at time $T_5$, VSS_I is lowered from VCCL to VSS to save static power and also to prevent overdriving the circuit elements in the integrated circuit. Once VSS_I is fully ramped to 0 volt, the ENPB and ENP signals can then be respectively de-asserted high (i.e., driven to VCCL or logic "1") and low (i.e., logic "0") at time $T_6$. This allows the normal interblock signals to operate normally in the user mode. Subsequently, logic circuit 204 will start driving signals at VCCL without causing any contention issue since the signals are driving to the same VCCL levels.

Figure 5:
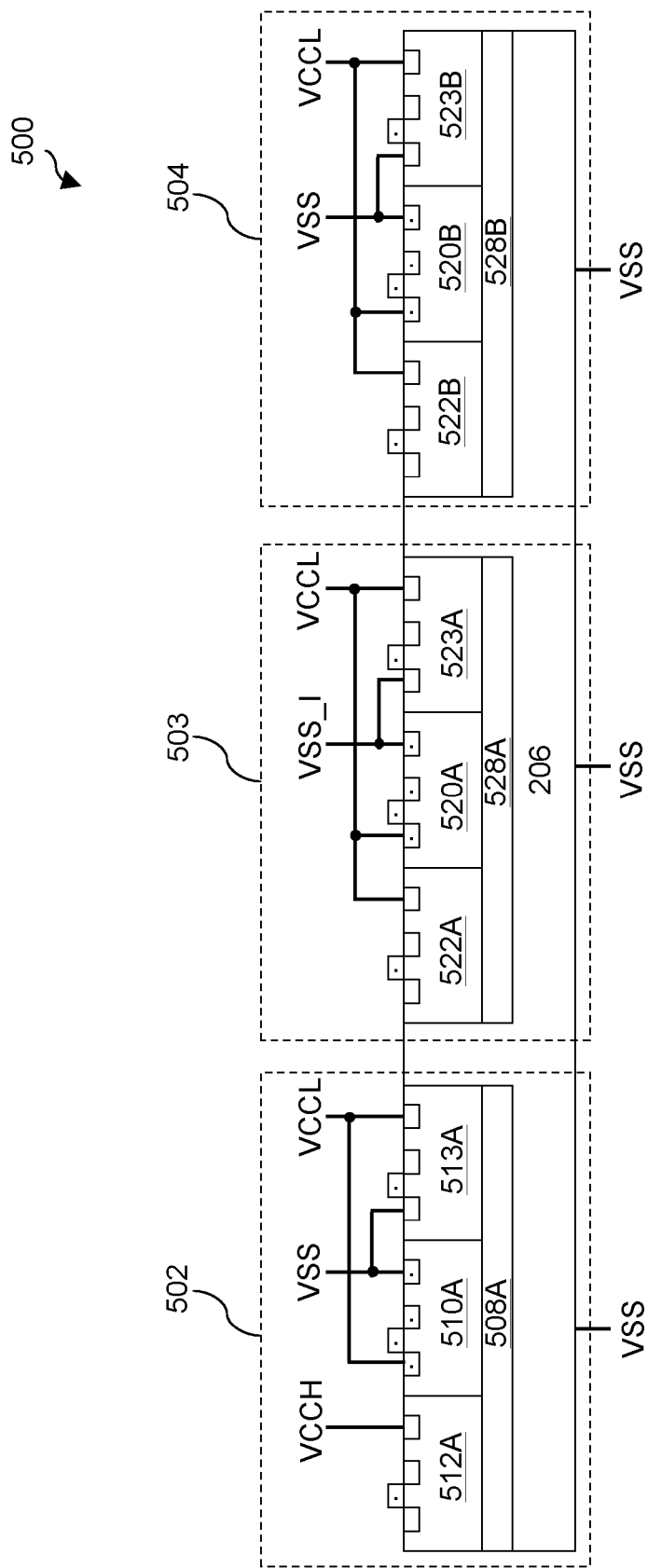
FIG. 5 shows another structure of an illustrative integrated circuit having a switch circuit, an isolation circuit, and a logic circuit formed in a semiconductor substrate in accordance with an embodiment of the present invention.

In the case when a logic circuit is disabled from operating during the switch programming operation, an intermediate triple well arrangement that includes a thin-oxide isolation circuit can be used to allow the logic circuit to remain logically operational during the switch programming operation. FIG. 5 shows a structure of an illustrative integrated circuit 500 having switch circuit 502, isolation circuit 503, and logic circuit 504 formed in semiconductor substrate 206 in accordance with one embodiment of the present invention. Positive power supply voltages VCCH or VCCL may be provided to switch circuit 502. Positive power supply voltage VCCL may be provided to isolation circuit 503 and logic circuit 504. Ground voltage VSS may be provided from an external source to switch circuit 502 and logic circuit 504. It should be noted that integrated circuit 500 may be formed in a similar process (i.e., triple well process) as integrated circuit 200 of FIG. 2 (e.g., switch circuit 202 and logic circuit 204). As such, for the sake of brevity, the similar components (e.g., P-well 510A, P-well 520A, P-well 520B, N-well 512A, N-well 513A, N-well 522A, N-well 523A, N-well 522B, N-well 523B, deep N-well 508A, deep N-well 528A, deep N-well 528B, and P-type substrate 206) that collectively form a group of transistors within respective switch circuit 502, isolation circuit 503, and logic circuit 504 will not be described in detail.

In order to enable logic circuit 504 to remain logically operational during the switch programming operation, isolation circuit 503 is implemented to isolate high voltage nodes from switch circuit 502 from low voltage nodes from logic circuit 504. The use of triple well isolation in integrated circuit 500 allows isolation circuit 503 to be biased separately from switch circuit 502, logic circuit 504, and P-type substrate 206. For example, as shown in FIG. 5, switch circuit 502 and logic circuit 504 may be supplied with a bias signal and voltage VSS, and isolation circuit 503 may be supplied with another bias signal and bias voltage VSS_I. Isolation circuit 503 is connected to an isolated P-well (e.g., R-well 520A) so that the supplied VSS_I can be modified. Such a configuration creates an ability for isolation circuit 503 to drive signals between switch circuit 502 and logic circuit 504 without causing current contention. As such, logic circuit 504 is able to stay logically operational during the switch programming operation.

Figure 6:
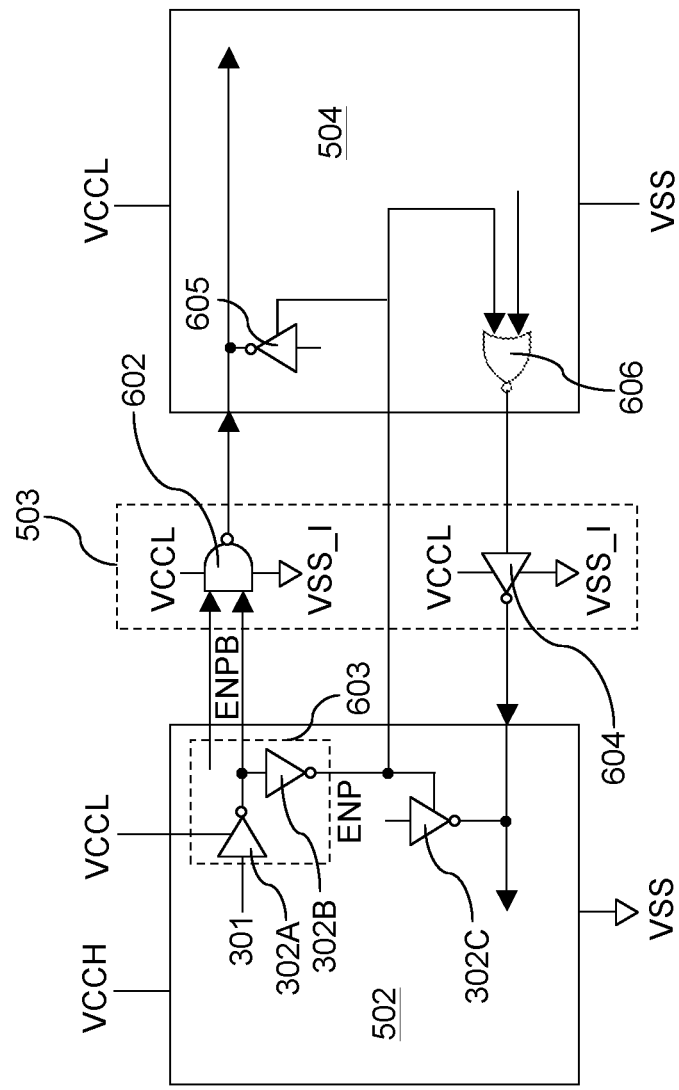
FIG. 6 is a corresponding circuit diagram of the illustrative integrated circuit of FIG. 5 in accordance with one embodiment of the present invention.

FIG. 6 is a corresponding circuit diagram of the illustrative integrated circuit 500 of FIG. 5 in accordance with one embodiment of the present invention. As described above, integrated circuit 500 includes switch circuit 502, isolation circuit 503, and logic circuit 504. Switch circuit 502 may be substantially similar to switch circuit 202 of FIGS. 3A and 3B and thus, similar circuit elements (e.g., inverter driver circuits 302A, 302B, 302C, and 302D, driver circuit 340, and buffer circuit 360) are not shown or described again for the sake of brevity. Inverter driver circuits 302A and 302B may be collectively referred to as internal circuit 603. In one embodiment, internal circuit 603 enables the internal driving of input signals of switch circuit 502. Isolation circuit 503 may include tri-state NAND gate 602 and tri-state inverter circuit 604. Logic circuit 504 may include tri-state inverter circuit 605 and NOR gate 606.

When the programming mode is activated on integrated circuit 500, the input signals of switch circuit 502 may be driven to high voltage (e.g., VCCH) to facilitate the high-voltage switch programming operation. It should be appreciated that the circuit configuration of switch circuit 202 of FIG. 3B may be used by switch circuit 502 to facilitate the switch programming operation. In this mode, control signal 301 is first applied to inverter driver circuit 335, which is shown in FIG. 3B. An inverted version of control signal 301 is then applied to internal circuit 603, causing internal circuit 603 to generate (via inverter driver circuit 302A) a switch control signal ENPB of logic level "0" and its inverted signal ENP of logic level "1". The ENPB signal is provided to logic circuit 504 through isolation circuit 503 to set logic circuit 504 at a "don't care" state, which means that no matter what input (e.g., control signal 301) is applied to logic circuit 504, the input will have no effect on the output of logic circuit 504, because the output signal of NAND gate circuit 602 remains a logic level "1" in response to the ENPB signal being a logic level "0." Such a configuration ensures that the output of logic circuit 504 can be driven out (through NOR gate 606) at its nominal operating voltage (i.e., VCCL) prior to the switch programming operation.

Accordingly, VSS_I is adjusted relative to VCCL when the ENPB signal is asserted at logic level "0". As VSS_I is ramped towards VCCL, isolation circuit 503 is tri-stated (i.e., put into a high impedance state) and functions to isolate logic circuit 504 from switch circuit 502 during the switch programming operation. As such, VCCH can be increased (i.e. from 1 volt to 2 volts) accordingly, and switch circuit 502 will be able to drive the high-voltage logic signals (i.e., switch-programming logic signals) directly (i.e., using driver circuit 340 and buffer circuit 360 of FIG. 3B) to program integrated circuit 500 without causing current contention with logic circuit 504. Accordingly, logic circuit 504 is able to remain operational without being subjected to high voltage during the switch programming operation.

Once the switch programming operation is completed, VCCH is lowered to VCCL, and switch circuit 502 will be able to drive its input signals to VCCL through internal circuit 603. Accordingly, VSS_I is adjusted relative to VSS. In this scenario, isolation circuit 503 may function like a corresponding normal (non-tri-state) circuit and "de-isolate" switch circuit 502 from logic circuit 504. Subsequently, the ENPB signal is de-asserted at logic level "1" to allow normal inter-block signals to operate normally between switch circuit 502 and logic circuit 504 in the user mode.

Figure 7:
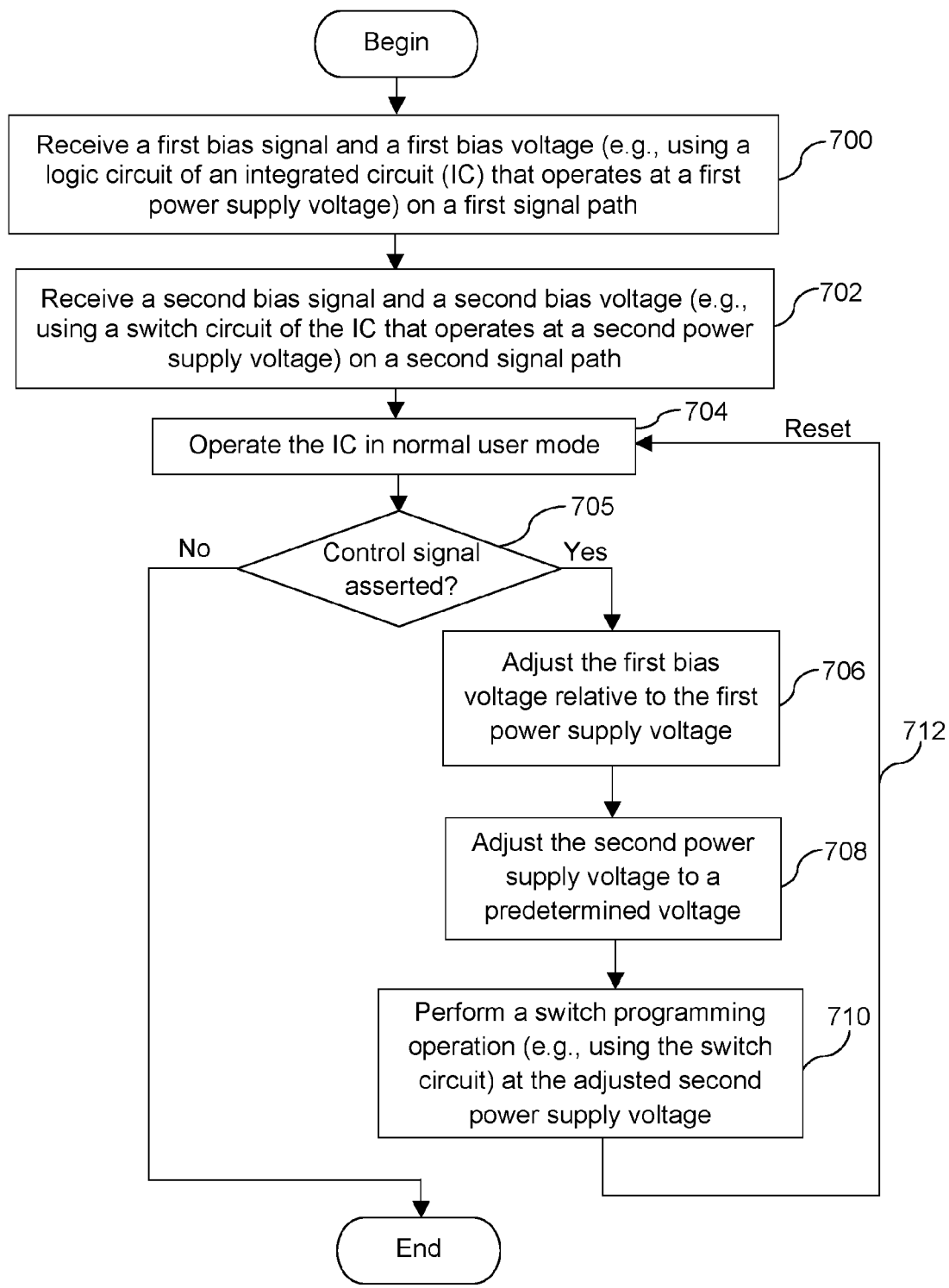
FIG. 7 is a flow chart of illustrative steps for operating an integrated circuit in accordance with one embodiment of the present invention.

FIG. 7 is a flow chart of illustrative steps for operating an integrated circuit in accordance with one embodiment of the present invention. It should be appreciated that the embodiments of FIGS. 2, 3A, 3B, 5, and 6 may be used as examples implemented by the steps described below.

At step 700, a first bias signal and a first bias voltage are received using a logic circuit of the integrated circuit on a first signal path, where the logic circuit operates at a first power supply voltage. For example, as shown in FIGS. 2, 3A, and 3B, bias signal and bias voltage VSS_I are received using logic circuit 204 of integrated circuit 200 on signal path 322, where logic circuit 204 operates at power supply voltage VCCL. In another example, as shown in FIGS. 5 and 6, bias signal and bias voltage VSS_I are received using isolation circuit 503 of integrated circuit 500, where isolation circuit 503 operates at power supply voltage VCCL. In one embodiment, isolation circuit 503 may be a logic circuit that is configured to provide isolation between switch circuit 502 and logic circuit 504 of FIGS. 5 and 6.

At step 702, a second bias signal and a second bias voltage are received using a switch circuit of the integrated circuit on a second signal path, where the switch circuit operates at a second power supply voltage. For example, as shown in FIGS. 2, 3A, and 3B, bias signal and bias voltage VSS are received using switch circuit 202 of integrated circuit 200 on signal path 320, where switch circuit 202 operates at power supply voltage VCCH or power supply voltage VCCL, depending on the operation mode of the integrated circuit. In another example, as shown in FIGS. 5 and 6, VSS is received using switch circuit 502 and logic circuit 504.

When the integrated circuit is powered on, the integrated circuit operates in a normal user mode at step 704. For example, referring to FIGS. 2, 3A, 3B, 5, and 6, integrated circuits 200 and 500 may be supplied with VCCL to be powered on. In this scenario, the powered-on integrated circuits may operate in the normal mode of operation (i.e., user mode) after being initialized in a predetermined manner upon the activation of the powered-on integrated circuit.

In one embodiment, the logic circuit is responsive to a switch control signal (e.g., ENPB signal of FIGS. 2, 3, 5, and 6) having two logic states (e.g., logic "1" or logic "0") indicative of the two operating modes on the integrated circuit. The switch control signal is generated by the switch circuit as part of a voltage handling mechanism to protect the logic circuit from excessive voltages during the switch programming operation. For example, as shown in FIG. 3B, when the programming mode is activated on the integrated circuit, a control signal (e.g., control signal 301) is first applied to the internal circuit (e.g., internal circuit 303 of FIGS. 3A and 3B) of the switch circuit (e.g., switch circuit 202 of FIG. 3B), causing the internal circuit to generate the switch control signal at the first logic state (e.g., logic "1" or 1V). In this mode, the first bias voltage VSS_I (e.g., VSS_I of FIGS. 2, 3A, 3B, 5 and 6), and the second power supply voltage (e.g., VCCH) may be adjusted to enable the switch circuit to be powered at a higher voltage without causing any contention problems with other low-power logic circuits.

For example, as shown in FIG. 3B, if the switch control signal ENPB is asserted at step 705, VSS_I is adjusted relative to the first power supply voltage VCCL at step 706 so that transistors 230, 232, and 234 of logic circuit 204 can be turned off to cut off a conductive path between switch circuit 202 and logic circuit 204. For example, VSS_I may be increased to equal VCCL (e.g., as shown between $T_2$ and $T_5$ in FIG. 4) in step 706 so that there is no voltage drop across transistors 230, 232, and 234. This is to prevent logic circuit 204 from being subjected to excessive voltage during the switch programming operation. Accordingly, the second power supply voltage that is supplied to the switch circuit is adjusted relative to a predetermined voltage at step 708. In one embodiment, the predetermined voltage is applied to the switch circuit to enable the switch programming operation on the integrated circuit. The predetermined voltage may be higher than the normal operation voltage of the integrated circuit. The predetermined voltage may be a high voltage of, for example, 2 volts. As such, the switch circuit is powered at a higher voltage without causing any contention problems with other low-voltage circuit elements.

Such a configuration allows the switch programming operation to be performed at the adjusted second power supply voltage using the switch circuit at step 710. Once the switch programming operation is completed, the switch control signals (i.e., ENP and ENPB signals), the first bias voltage VSS_I, and power supply voltage VCCH are reset to their original configuration states in the user mode at step 712.

The present exemplary embodiments may be practiced without some or all of these specific details described with reference to the respective embodiments. In other instances, well-known operations have not been described in detail in order not to obscure unnecessarily the present embodiments.

The methods and apparatuses described herein may be incorporated into any suitable circuit. For example, the methods and apparatuses may be incorporated into numerous types of devices such as microprocessors or other integrated circuits. Exemplary integrated circuits include programmable array logic (PAL), programmable logic arrays (PLAs), field programmable logic arrays (FPGAs), electrically programmable logic devices (EPLDs), electrically erasable programmable logic devices (EEPLDs), logic cell arrays (LCAs), field programmable gate arrays (FPGAs), application specific standard products (ASSPs), application specific integrated circuits (ASICs), and microprocessors, just to name a few.

Although the method operations were described in a specific order, it should be understood that other operations may be performed in between described operations, described operations may be adjusted so that they occur at slightly different times or described operations may be distributed in a system which allows the occurrence of the processing operations at various intervals associated with the processing, as long as the processing of the overlay operations are performed in a desired way.

What is claimed is:

1. An integrated circuit formed using a semiconductor substrate, comprising:
    a logic circuit within a first triple well structure within the semiconductor substrate that is supplied with a first bias voltage and operates at a first power supply voltage; and
    a switch circuit within a second triple well structure within the semiconductor substrate that is electrically isolated from the first triple well structure and is supplied with a second bias voltage, wherein the switch circuit operates at a second power supply voltage, and wherein the switch circuit receives a control signal that controls the first bias voltage.

2. The integrated circuit defined in claim 1, wherein the switch circuit comprises a driver circuit to selectively apply a signal to the logic circuit in response to the control signal and the first bias voltage.

3. The integrated circuit defined in claim 1, wherein the second power supply voltage is greater than the first power supply voltage.

4. The integrated circuit defined in claim 1, wherein the control signal has a first logic state and a second logic state, wherein the first logic state enables a programming operation of the integrated circuit, and wherein the second logic state disables the programming operation of the integrated circuit.

5. The integrated circuit defined in claim 4, wherein the switch circuit controls the first bias voltage to be adjusted relative to the first power supply voltage when the control signal is in the first logic state.

6. The integrated circuit defined in claim 4, wherein the switch circuit controls the first bias voltage to be adjusted relative to the second bias voltage when the control signal is in the second logic state.

7. The integrated circuit defined in claim 4, wherein a portion of the logic circuit remains operational during the programming operation of the integrated circuit.

8. The integrated circuit defined in claim 1, wherein the second bias voltage comprises a ground voltage.

9. The integrated circuit defined in claim 1, wherein the logic circuit comprises an interconnect circuit.

10. The integrated circuit defined in claim 1, wherein the logic circuit comprises an isolation circuit.

11. An integrated circuit comprising:
    a logic circuit that operates in a first power supply domain, wherein the logic circuit receives a first bias signal on a first signal path; and
    a switch circuit that operates in a second power supply domain that is different than the first power supply domain, wherein the switch circuit receives a second bias signal on a second signal path that is different than the first signal path and a control signal that controls a voltage of the first bias signal to turn off a transistor in the logic circuit during a programming operation of the integrated circuit.

12. The integrated circuit defined in claim 11, wherein the switch circuit is electrically isolated from the logic circuit within a semiconductor substrate that forms the integrated circuit.

13. The integrated circuit defined in claim 11, wherein the control signal has a first logic state and a second logic state, wherein the first logic state enables the programming operation of the integrated circuit and the second logic state disables the programming operation of the integrated circuit.

14. The integrated circuit defined in claim 13, wherein the switch circuit controls the voltage of the first bias signal to be adjusted relative to the first power supply voltage when the control signal is in the first logic state.

15. The integrated circuit defined in claim 13, wherein the switch circuit controls the voltage of the second bias signal to be adjusted relative to a voltage of the second power supply domain when the control signal is in the second logic state.

16. The integrated circuit defined in claim 11, wherein the second bias signal comprises a ground signal.

17. The integrated circuit defined in claim 11, wherein the first power supply domain comprises a first power supply voltage and the second power supply domain comprises a second power supply voltage that is greater than the first power supply voltage.

18. A method of operating an integrated circuit, comprising:
    receiving a first bias signal using a logic circuit through a first signal path, wherein the logic circuit operates in a first power supply voltage;
    receiving a second bias signal using a switch circuit through a second signal path that is different than the first signal path, wherein the switch circuit operates in a second power supply voltage that is higher than the first power supply voltage; and
    controlling a voltage of the first bias signal to the logic circuit in response to a control signal to turn off a transistor in the logic circuit during a programming operation of the integrated circuit.

19. The method defined in claim 18, wherein the control signal has a first logic state and a second logic state, wherein the first logic state enables the programming operation of the integrated circuit, and wherein the second logic state disables the programming operation of the integrated circuit, the method further comprising:
    adjusting the voltage of the first bias signal relative to the first power supply voltage when the control signal is in the first logic state.

20. The method defined in claim 19, further comprising:
    adjusting the second power supply voltage relative to a predetermined voltage when the control signal is in the first logic state.

21. The method defined in claim 19, further comprising:
  adjusting the voltage of the first bias signal relative to a voltage of the second bias signal when the control signal is in the second logic state.

\* \* \* \* \*